(12) United States Patent
Watanabe et al.

(10) Patent No.: US 6,901,133 B2
(45) Date of Patent: May 31, 2005

(54) X-RAY EXPOSURE METHOD AND SEMICONDUCTOR DEVICE MANUFACTURED USING THIS X-RAY EXPOSURE METHOD AS WELL AS X-RAY MASK, X-RAY EXPOSURE UNIT AND RESIST MATERIAL

(75) Inventors: Hiroshi Watanabe, Hyogo (JP); Kenji Itoga, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 57 days.

(21) Appl. No.: 10/238,961

(22) Filed: Sep. 11, 2002

(65) Prior Publication Data

US 2003/0174805 A1 Sep. 18, 2003

(30) Foreign Application Priority Data

Mar. 13, 2002 (JP) ........................................ 2002-068748

(51) Int. Cl.$^7$ ............................................... G21K 5/00
(52) U.S. Cl. ........................................... 378/34; 378/35
(58) Field of Search .................... 378/34, 35; 430/5, 430/30; 250/492.1, 492.2, 492.22

(56) References Cited

U.S. PATENT DOCUMENTS 6,249,335 B1 * 6/2001 Hirukawa et al. ............. 355/53
6,272,202 B1 * 8/2001 Chiba et al. .................. 378/34
6,366,639 B1 * 4/2002 Ezaki et al. ................... 378/34
6,620,556 B2 * 9/2003 Ohsaki ........................... 430/5
6,620,564 B2 * 9/2003 Hung et al. .................... 430/30
6,647,087 B2 * 11/2003 Amemiya et al. ............ 378/34

FOREIGN PATENT DOCUMENTS

JP           62-65420           3/1987

OTHER PUBLICATIONS

Vladimirsky, Olga et al.; "Sub–100 nm Imaging in X–ray Lithography", part of the SPIE Conference on Emerging Lithographic Technologies III, Proceedings of SPIE, vol. 3676, pp. 478–484, (Mar. 1999).
Fujii, K. et al.; "Low–dose exposure technique for . . . x–ray lithography", Journal of Science & Technology B, vol. 16, No. 6, pp. 3504–3508, (Nov./Dec. 1998).
Watanabe, Hiroshi et al.; "Microprocesses and Nanotechnology", 2001 Intl. Microprocesses and Nanotechnology Conf., Oct. 31–Nov. 2, 2001, Japan.

* cited by examiner

*Primary Examiner*—Edward J. Glick
*Assistant Examiner*—Hoon Song
(74) *Attorney, Agent, or Firm*—Leydig, Voit & Mayer, Ltd.

(57) ABSTRACT

The pattern dimensions of an X-ray absorber are made approximately 1.5 times (approximately 75 nm) a pattern half pitch (L/2=50 nm). Thereby, a high quality optical image can be obtained since the contrast in regard to X-rays of wavelengths shorter than approximately 8 Å to 9 Å is improved vis-à-vis the contrast of a 50 nm line and space periodic mask pattern. As a result, an X-ray exposure method produces a high resolution, and a semiconductor device manufactured by this X-ray exposure method as well as an X-ray mask, X-ray exposure unit and resist material.

3 Claims, 11 Drawing Sheets

DIAMOND FILM THICKNESS(μm)

WAVELENGTH(Å)

X-RAY EXPOSURE METHOD AND SEMICONDUCTOR DEVICE MANUFACTURED USING THIS X-RAY EXPOSURE METHOD AS WELL AS X-RAY MASK, X-RAY EXPOSURE UNIT AND RESIST MATERIAL

BACKGROUND OF THE INVENTION

1. Field of the Invention

The present invention relates to an X-ray exposure method using fine pattern formation technology and a semiconductor device manufactured using this X-ray exposure method as well as an X-ray mask, an X-ray exposure unit and a resist material, in particular, to an X-ray exposure method and a semiconductor device manufactured using this X-ray exposure method as well as an X-ray mask, an X-ray unit and a resist material wherein finer pattern transcription is made possible in comparison with a prior art having a primary objective of the use of fine patterns on the surface of a mask in a system wherein a fine pattern manufactured on a mask is transcribed by means of X-ray proximity exposure technology with respect to transcription technology used primarily in semiconductor integrated circuit manufacture.

2. Description of the Background Art

FIG. 15 schematically shows the conventional X-ray proximity exposure method. X-rays 1 emitted from an electron storage ring 10 are condensed to a predetermined range by a mirror 2, are transmitted through an X-ray vacuum protection filter 3, and irradiate a wafer 6, having a resist 5 attached thereto, arranged in proximity to an X-ray mask 4 so as to have a predetermined gap from this X-ray mask 4. The pattern of X-ray mask 4 is formed of X-ray absorber 4a and X-ray transmitting body 4b, and the X-rays that have been transmitted through X-ray absorber 4a and X-ray transmitting body 4b irradiate resist 5 on wafer 6. Secondary electrons are generated by resist 5 that has absorbed X-rays 1 and the X-ray mask pattern is transcribed onto resist 5 because of a chemical change caused in resist 5 due to those secondary electrons.

The resolution of X-ray proximity exposure is determined by two different factors. That is to say, the resolution limit of an optical image is determined according to Fresnel diffraction and the resolution limit is determined by so-called secondary electron fuzziness due to the spread of photoelectrons or Auger electrons, generated in a resist due to irradiation with exposure light, to a limited region. The higher the energy of electrons, the greater the fuzziness of secondary electrons and the lower the energy of the electrons, the smaller the fuzziness of secondary electrons. The shorter the X-ray absorption wavelength becomes, the higher the energy of photoelectrons from among secondary electrons becomes so as to lower the resolution.

On the other hand, the absorbed X-ray energy image formed in the resist is determined by the Fresnel diffraction of the X-rays transmitted through the X-ray mask and the resolution limit R thereof is expressed in the following equation.

$$R = k(\lambda \cdot G)^{1/2}$$

Here, k is a constant dependent on the mask absorber material, the mask pattern form as well as the exposure system. λ represents the X-ray wavelength absorbed by the resist and G represents the gap between the mask and wafer.

It is understood from this equation that, given the same resist and same exposure method, the shorter is the X-ray wavelength, or the smaller is the mask-wafer gap, the greater the resolution becomes and the longer is the X-ray wavelength, or the greater is the mask-wafer gap, the poorer the resolution becomes.

However, as for X-rays used for actual exposure, emitted light having a continuous spectrum that is emitted from electron storage ring 10, X-rays emitted from a plasma X-ray source having a narrow spectrum width that is comparatively close to that of a single wavelength and X-rays emitted from various other X-ray sources are used. Therefore, the resist absorbs X-rays of various wavelengths emitted from the X-ray source. Then, the sum of the absorbed energy images formed according to the respective wavelengths becomes the absorbed energy image in the resist.

Accordingly, in the shorter wavelength side of the exposure wavelength range, primarily fuzziness of secondary electrons in the resist increases and, in the longer wavelength side, primarily resolution is lowered due to Fresnel diffraction. Therefore, in the case of the use of X-rays 1 emitted from electron storage ring 10, which is the X-ray source, short wavelength components are reduced by primarily utilizing the point that the shorter is the wavelength, the lower is the reflectance of mirror 2. Moreover, long wavelength components are reduced by utilizing the point that the longer is the wavelength, the greater is the absorbed X-ray ratio of X-ray vacuum protection filter 3 and of X-ray transmitting body 4b of X-ray mask 4. Thereby, exposure is carried out in a wavelength range wherein short wavelength components and long wavelength components that have a possibility of causing the lowering of resolution are reduced.

(First Problem to be Solved)

Here, the first problem to be solved by the present invention is the inclusion of X-rays having wavelengths that degrade the quality of the absorbed energy image in the X-rays absorbed by the resist.

As for the spectrum of X-rays absorbed by the resist obtained according to the conventional X-ray proximity exposure method, FIG. 16 shows two examples in the case wherein X-ray transmitting body 4b of X-ray mask 4 is made of silicon carbide (SiC) having a film thickness of 2 μm and wherein X-ray transmitting body 4b is made of diamond having a film thickness of 2 μm.

Here, an electron accelerating voltage of electron storage ring 10 of 0.685 GeV with a magnetic deflection of 3.5 T, mirror 2 being a platinum coated mirror, X-ray vacuum protection filter 3 made of beryllium having a film thickness of 18 μm and resist 5 being a PHS resist with a base resin of a polyhydroxystyrene (PHS, formula $C_8H_8O_1$) are posited. As is shown in FIG. 16, in both cases wherein X-ray transmitting body 4b is of silicon carbide or diamond, a continuous X-ray in a range of approximately from 3 Å to 16 Å is absorbed by the resist.

In the case that the mask-wafer gap is constant and wherein the necessary resolution is set as Rr, if the resolution limit of all wavelengths of the X-rays absorbed by the resist 5 is higher than the necessary resolution Rr, then the necessary resolution Rr can be obtained without fail.

On the other hand, if X-rays of a wavelength lower than the resolution limit Rr are included among the X-rays irradiated on the surface of resist 5, the resolution of the absorbed energy image formed in resist 5 will be degraded.

Here, FIG. 17 shows an example of the contrast of the absorbed energy image absorbed in the resist according to respective X-ray wavelengths in regard to a 50 nm L and S (line and space) mask pattern, calculated in the range from 100 nm to 400 nm of a film thickness of a tungsten (W) X-ray absorber. The mask-wafer gap is 10 µm.

In the calculation, after calculating the absorbed image according to Fresnel diffraction, this is integrated with the relatively small Gaussian distribution σ=5 nm, as the fuzziness of an optical image and, thereby, the absorbed energy image was found. As for the contrast value, the amount of the resist absorption energy at the resist position directly beneath the center of the transmitting body pattern of the mask pattern is denoted as Imax, the amount of the resist absorption energy at the resist position directly beneath the center of the X-ray absorber pattern of the mask pattern is denoted as Imin so that the contrast was defined according to the following equation.

contrast=(Imax−Imin)/(Imax+Imin)

In other words, the greater the contrast is above 0, the sharper is the absorbed energy image and the easier it is to form the pattern. The upper limit of the contrast is 1. On the other hand, when the contrast is 0 or less, the absorbed energy image is degraded because the amount of absorbed energy below the transmitting body becomes smaller than the amount of absorbed energy below the X-ray absorber.

It is understood in reference to FIG. 17 that, in the case of a 50 nm L and S mask pattern, although also dependent on the film thickness of the X-ray absorber, in general the contrast becomes 0 or less, so that the absorbed energy image is degraded in regard to X-rays having wavelengths from 6 Å to 7 Å and X-rays having wavelengths longer than 8 Å to 8.5 Å from among the continuous X-rays absorbed by the resist in the range of from approximately from 3 Å to 12 Å. Though the wavelength range wherein the contrast becomes 0 or less, changes according to dependence on the pattern dimensions, the mask structure and the mask-wafer gap, a problem can be cited wherein, as described above, an X-ray wavelength range that lowers the resolution is included among the of X-ray spectrum absorbed by the resist.

In particular, the wavelength range of from 6 Å to 7 Å corresponds to the vicinity of the X-ray absorption edge (6.9 Å) of tungsten, which is the material of the X-ray absorber, and the X-ray absorption coefficient, as well as the amount of X-ray phase shift, of the X-ray absorber fluctuate greatly. Therefore, the contrast of the absorbed energy image is lowered. Consequently, a problem can be cited that when the absorption edge of the X-ray transmitting body and of the X-ray absorber are in the exposure wavelength range, the contrast of the absorbed energy image in the wavelength range in the vicinity of their absorption edges is lowered.

Further, the problem can be cited that when the film thickness and density of X-ray transmitting body 4b of X-ray mask 4 and of X-ray vacuum protection filter 3 are increased in order to reduce long wavelength components, wavelength components that contribute to resolution arriving at the surface of resist 5 are also reduced and throughput is lowered.

(Second Problem to be Solved)

Next, the second problem to be solved by the present invention is the inclusion of X-rays that lower resolution as a result of Fresnel diffraction of X-rays transmitted through the mask.

First, in reference to FIG. 18, the X-ray phase conditions for obtaining a high contrast optical image will be described. In the X-ray mask pattern wherein X-ray absorber 4a and X-ray transmitting body 4b are lined up in alternation in a periodic manner, in order to obtain a high contrast optical image, it is required for the X-rays transmitted through X-ray transmitting body 4b and the X-rays transmitted through X-ray absorber 4a to be mutually reinforced at point P on the surface of the resist directly beneath X-ray transmitting body 4b and to be mutually weakened at point Q on the surface of the resist directly beneath X-ray absorber 4a. In order for mutual strengthening directly beneath X-ray transmitting body 4b, it is ideal for the phase difference of the X-rays that have been transmitted through X-ray transmitting body 4b and the X-rays that have been transmitted through X-ray absorber 4a to be 0 at point P, in other words, to be of equiphase. Further, in order for mutual weakening directly beneath X-ray absorber 4a, it is ideal for the phase difference of the X-rays that have been transmitted through X-ray transmitting body 4b and the X-rays that have been transmitted through X-ray absorber 4a to be π at point Q, in other words, to be of antiphase.

The phase difference between the X-rays that have been transmitted through X-ray transmitting body 4b and the X-rays that have been transmitted through X-ray absorber 4a can be separated into two. One is the phase difference due to the X-ray optical path difference determined based on the mask-wafer gap and the positional relationship on the mask and the other is the phase difference occurring when X-rays are transmitted through X-ray absorber 4a. If it is assumed that the phase difference between X-ray transmitting body 4b and X-ray absorber 4a is −π/2 when the phase difference due to the optical path difference becomes π/2, the X-ray phase conditions are achieved wherein a high contrast optical image is obtained according to the conventional X-ray proximity exposure method.

For example, the phase difference of an X-ray absorber 4a is posited as −π/2 and the phase difference of X-rays that have been transmitted between points B–Q in relation to X-rays that have been transmitted between points A–Q is posited as π/2. At this time, the X-ray phase difference also becomes π/2 for X-rays that have been transmitted between points B–P in relation to X-rays that have been transmitted between points A–P. Consequently, X-ray phase conditions are achieved wherein high contrast can be obtained in relation to X-rays that have passed the center of the pattern.

Next, problems with this method are explained. As described above, only X-rays that are transmitted through the center portion of the pattern of X-ray transmitting body 4b and through the center portion of the pattern of X-ray absorber 4a fulfilled the ideal X-ray phase conditions but X-rays that are transmitted through positions shifted from the center portion can not necessarily be said to fulfill the ideal X-ray phase conditions.

Consider the phase difference due to the X-ray optical path difference of X-rays that have reached point Q having passed edge C of X-ray absorber 4a and X-rays that have reached point Q having passed edge D of X-ray transmitting body 4b. When the distance from point A to point C as well as the distance from point A to point D is L/2 and 3L/2, respectively, the phase difference due to the optical path difference for X-rays that have been transmitted between points C–Q and X-rays that have been transmitted between points D–Q is expressed in the following equation (1).

$$((3L/2)^2−(L/2)^2)/2/G/\lambda \times 2\pi = 2 \cdot L^2/2/G/\lambda \times 2\pi \quad (1)$$

Here, G is the mask-wafer gap and λ is the wavelength of the incident X-rays.

Furthermore, the phase difference due to the optical path difference for X-rays that have passed between points B–Q in relation to X-rays that have passed between points A–Q is expressed in the following equation (2).

$$L^2/2/G/\lambda \times 2\pi = \pi/2 \qquad (2)$$

When equation (2) is substituted in equation (1) the phase difference due to the optical path difference becomes π.

Consequently, it is clear that this deviates from the X-ray phase condition π/2 wherein a high contrast can be obtained. Therefore, the problem of lowering of resolution due to irradiation by X-rays deviating from optimum X-ray phase conditions such as these can be cited.

Further, as for a method to obtain resist pattern dimensions smaller than the pattern dimensions of an X-ray transmitting part of a mask pattern using Fresnel diffraction, an X-ray transmitting part with pattern dimensions approximately two times wider than the necessary resist pattern dimensions is used. Therefore, a problem can be cited wherein the smallest pitch among the resist pattern becomes more than two times wider than the resist pattern dimensions and an increase in integration of semiconductor circuits becomes difficult.

SUMMARY OF THE INVENTION

The present invention has been made to solve each of the above-mentioned problems, and an object thereof is to provide an X-ray exposure method and a semiconductor device manufactured by using this X-ray exposure method as well as an X-ray mask, an X-ray exposure unit and a resist material, each of which can obtain a high resolution.

In one aspect of an X-ray exposure method according to the present invention, an X-ray exposure method wherein X-rays emitted from an X-ray source irradiate a resist after transiting at least one of a mirror and an X-ray filter and an X-ray transmitting body is characterized in that a resist pattern of minimum pattern dimensions (R) is transcribed with a mask-wafer gap (G), and a ratio of absorbed energy on the wavelength side longer than λlimit (=0.034×R²/G) to the total absorbed energy becomes 0.3 or less in the absorption spectrum absorbed by the resist.

According to this X-ray exposure method, when the wavelength which degrades the absorbed energy image in regard to minimum pattern dimensions R is posited as λlimit, an improvement in resolution can be expected in regard to minimum pattern dimensions R of any gap in the case that narrow banding is carried out so that the absorption ratio of X-rays on the wavelength side longer than the λlimit of the total absorbed energy becomes 0.3 or less.

Further, resolution is proportional to k(λ×G)^(1/2), so that the wavelength λlimit which degrades the absorbed energy image is considered to be proportional to R2/G. In the case of λlimit=8.5 Å, R=50 nm and G=10 μm, the proportional coefficient is 0.034 (=8.5 Å/50 nm²×10 μm). Consequently, by reducing X-rays of the long wavelength side beyond λlimit obtained according to λlimit=0.034×R²/G, an improvement in resolution can also be expected in regard to differing pattern dimensions and mask-wafer gaps.

Further, in another aspect of an X-ray exposure method according to the present invention, an X-ray exposure method for using a periodic mask pattern in which an X-ray absorber mask pattern and a space pattern without an X-ray absorber are aligned in alternation, and thereby forming a periodic pattern on a resist, is characterized in that the X-ray absorber mask pattern dimensions are in a range of approximately 1.2 times to approximately 1.8 times the half pitch of the periodic mask pattern.

According to this X-ray exposure method it was confirmed that the pattern dimensions of the X-ray absorber have a peak of from 1.2 times to 1.8 times the half pitch of the periodic mask pattern and when it gets wider than that, contrast becomes degraded. Consequently, it becomes possible to obtain a high quality optical image by setting the pattern dimensions of the X-ray absorber in the range of approximately 1.2 to 1.8 times the pattern half pitch.

The wavelength range that contributes to the contrast fluctuates according to the pattern dimensions and to the mask-wafer gap so, naturally, the wavelength range used in the case of the formation of a finer pattern may differ from that of the present embodiment. Nevertheless, even in that case, by making the pattern dimensions of the X-ray absorber wider than the pattern half pitch, the effect of improvement in contrast and expansion of the wavelength range that can contribute to contrast can be expected.

Further, a semiconductor device characterized by using the above-mentioned X-ray exposure method, and thereby being manufactured through processing of a resist pattern formed on a substrate.

According to this semiconductor device, a mask pattern of which the X-ray absorber pattern dimensions are approximately 1.2 to approximately 1.8 times larger than the half pitch of the periodic pattern is used and, thereby, a pattern of a high degree of resolution can be obtained even when the mask-wafer gap is made wider than in the prior art. By widening the mask-wafer gap, mask damage due to substrate contact can be prevented and, at the same time, high-speed movement of the stage for the substrate with attached resist becomes possible, which is extremely important for increasing throughput.

Further, in an X-ray mask according to this invention, an X-ray mask pattern having a periodic mask pattern in which an X-ray absorber mask pattern and a space pattern without an X-ray absorber are aligned in alternation, is characterized in that said X-ray absorber mask pattern dimensions are in a range of approximately 1.2 times to approximately 1.8 times the half pitch of the periodic mask pattern.

According to this X-ray mask, it was confirmed that the pattern dimensions of the X-ray absorber have a peak of from 1.2 times to 1.8 times the half pitch of the periodic mask pattern and that, when they get wider than that, a wavelength range that lowers contrast exists. Consequently, it becomes possible to obtain a high quality optical image by setting the pattern dimensions of the X-ray absorber in the range of approximately from 1.2 to 1.8 times the pattern half pitch.

The wavelength range that contributes to the contrast fluctuates according to the pattern dimensions and to the mask-wafer gap so, naturally, the wavelength range used in the case of the formation of a finer pattern may differ from that of the present embodiment. Nevertheless, even in that case, by making the pattern dimensions of the X-ray absorber wider than the pattern half pitch, the effect of improvement in contrast and expansion of the wavelength range that can contribute to contrast can be expected.

Further, in an X-ray exposure unit according to this invention, an X-ray exposure unit utilizing X-rays for pattern formation, is characterized by using an X-ray absorption spectrum having a wavelength range in which absorption intensity is half the maximum becomes the range of 2.5 Å or less.

According to this X-ray exposure unit, it becomes possible to obtain a high resolution by restricting fuzziness due to secondary electrons in the resist and fuzziness of an optical image due to Fresnel diffraction.

Further, in a resist material according to this invention, A resist material used in X-ray exposure that X-rays are utilized for pattern formation, is characterized by containing an element that narrow bands an absorbed X-ray wavelength range in comparison with a wavelength range of irradiated X rays.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
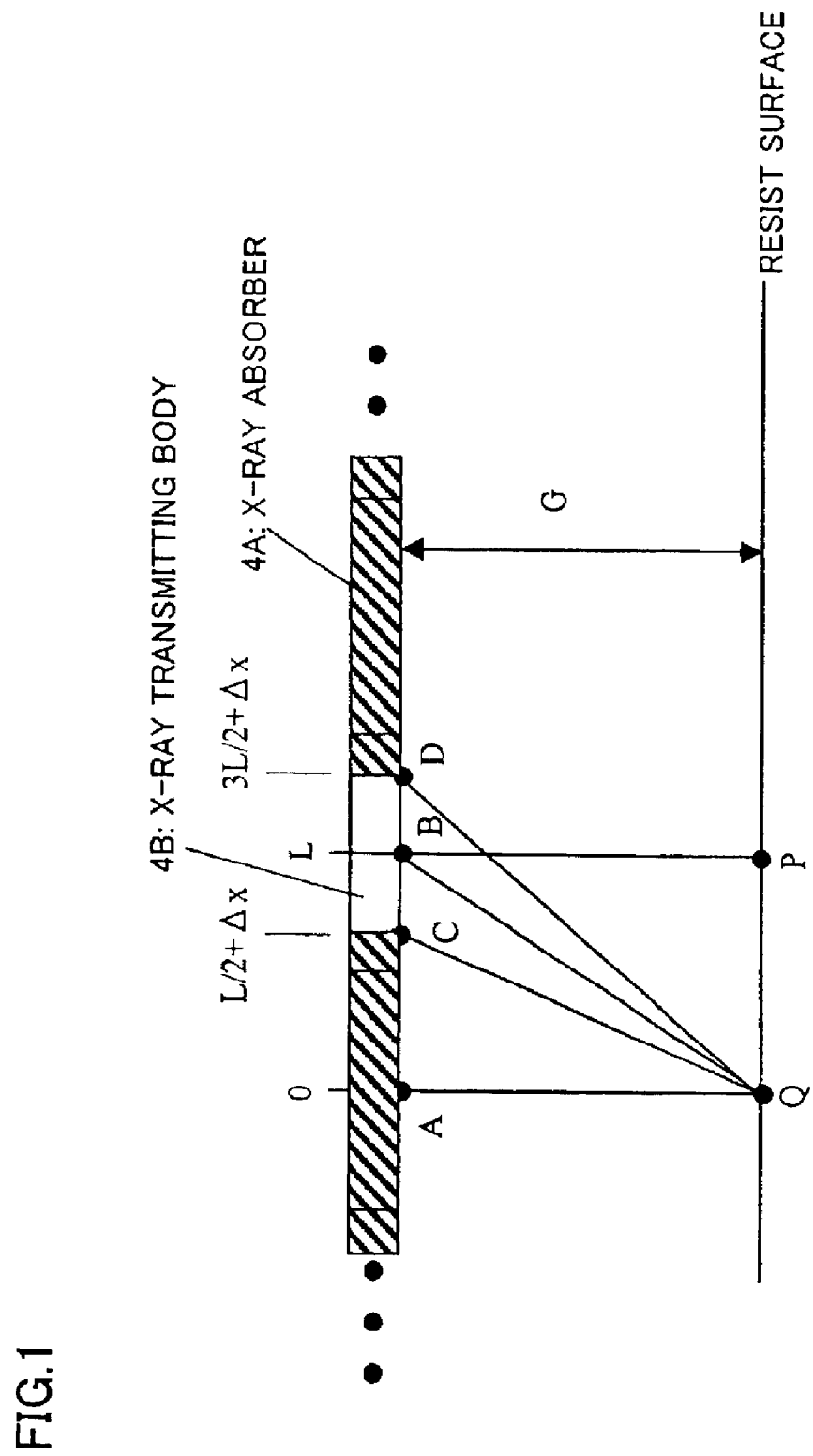
FIG. 1 is a schematic diagram for describing the relationship between mask absorber dimensions of a periodic pattern and X-ray phase conditions according to the effect of the present invention.

The embodiments according to the present invention are described below in reference to the drawings. First, the principle of the present invention is described. Further, though the below description is primarily an explanation of the case of the use of X-rays radiated from a radiation generation unit, there is, in accordance with the principle of the invention, no limitation to X-rays radiated from a radiation generation unit and, naturally, the same effects may be obtained with the use of various types of X-ray sources, including plasma X-ray sources.

(Means 1)

As a first means, an X-ray exposure method is cited wherein a method to reduce short wavelength components and a method to reduce long wavelength components are used in combination so that the exposure wavelength range is narrow banded for exposure. Short wavelength components are reduced through the use of filters or X-ray transmitting bodies that include absorption edges in the exposure wavelength range. There are two methods for reducing long wavelength components. In one, a resist material that contains elements that narrow band the wavelength range of absorbed X-rays in comparison with the irradiated X-ray wavelength range is used. In the other, an X-ray filter is inserted into the beam line.

(Means 2)

As a second means, a method wherein the X-ray absorber pattern dimensions of a line and space pattern are made approximately 1.2 times to approximately 1.8 times, preferably approximately 1.4 times to approximately 1.6 times, wider than the pattern half pitch is cited.

(Effects)

The effects of Means 1 are herein described. There is a physical property wherein X-ray transmittance becomes higher as wavelength becomes shorter and the transmittance precipitously lowers when the absorption edge is exceeded and, when the wavelength is further shortened, the transmittance again becomes higher. Consequently, because the absorptance of wavelengths shorter than the absorption edge becomes high, the absorption edges of the filter material and mirror coating material can be utilized to reduce the short wavelength components in regard to X-rays transmitted through the filter and X-rays reflected off the mirror. Further, in the case of the X-ray mirror, the characteristic wherein short wavelength components are reduced as the incident angle of X-rays becomes larger can be utilized in order to reduce short wavelength components.

A resist pattern is formed according to the X-rays absorbed by the constituent material of the resist. The shorter is the wavelength, the lower is the absorption of X-rays by a resist and absorption precipitously increases when wavelengths become shorter than the absorption edge of the constituent material of the resist. Absorption again lowers when the wavelength is further shortened. Consequently, when the absorption edge of the constituent material of the resist is within the X-ray exposure wavelength range, absorption of the wavelength side shorter than the absorption edge increases more than absorption of the wavelength side longer than the absorption edge. Therefore, this has the same effect as the relative reduction of long wavelength components and long wavelength components that lower resolution can be reduced.

Further, as for the method of utilizing the absorption edge of the resist constituent material in order to relatively reduce long wavelength components, the film thickness and density of the filter or X-ray transmitting body cannot be changed so throughput is not lowered, rather, the absorption of wavelength components shorter than the absorption edge increases and throughput is improved.

In this manner, fuzziness due to secondary electrons in the resist can be reduced and, further, long wavelength components that degrade resolution can be reduced by using a method to reduce short wavelength components and a method to reduce long wavelength components in combination and, therefore, exposure can be carried out through narrow banding so as to obtain a high resolution in comparison with the prior art.

Next, the effects of Means 2 are described. FIG. 1 shows a pattern wherein the X-ray absorber pattern dimensions are widened by just 2×ΔX. Consider the phase difference due to the optical path difference of X-rays that have reached point Q having passed edge C of X-ray absorber 4a and X-rays that have reached point Q having passed edge D of X-ray transmitting body 4b. The distances from point A to point C as well as from point A to point D, respectively, are L/2+ΔX and 3L/2−ΔX so that the phase difference φ (dq−cq) due to the optical path difference of X-rays that have been transmitted between points C−Q and X-rays that have been transmitted between points D−Q is expressed in the following equation (3).

$$\phi\ (dq-cq)=((3L/2-\Delta X)^2-(L/2+\Delta X)^2)/2/G/\lambda\times 2\pi=2L^2/2/G/\lambda\times (1-2\times\Delta X/L)\times 2\pi \quad (3)$$

Here, G is the mask-wafer gap and λ is the wavelength of the incident X-rays.

Further, when the phase difference is φ (aq−bq) due to the optical path difference of X-rays that have passed between points B−Q in regard to X-rays that have passed between points A−Q, then, $$\phi\ (aq-bq)=L^2/2/G/\lambda\times 2\pi \quad (4)$$

When equation (4) is substituted in equation (3) and arranged, $$\Delta X/L=(1-\phi\ (dq-cq)/2/\phi\ (aq-bq))/2$$

Here, when ΔX=L/4, phase difference φ (dq−cq) due to the optical path difference and optical path difference φ (aq−bq) become equal. In other words, φ (dq−cq) also becomes π/2 when ΔX=L/4 in the case that the phase difference of the X-ray absorber =−π/2 and φ (aq−bq)=π/2, which fulfills phase conditions for obtaining a high contrast and, therefore, X-rays that have been transmitted between points C−Q and X-rays that have been transmitted between points D−Q do not degrade the optical image.

Further, because the optical path difference between points A−C in regard to between points C−Q and the optical path difference between points D−Q in regard to between points B−Q are equal, X-rays that have been transmitted through an arbitrary point between points A−C and X-rays fulfilling phase conditions wherein a high contrast can be obtained at point Q necessarily exist between points B−D.

In other words, X-rays that have been transmitted between points A−C and X-rays that have been transmitted between points B−D all fulfill the phase conditions wherein a high contrast can be obtained at point Q. Therefore, by making the mask X-ray absorber dimensions approximately 1.5 times half the pattern pitch (pattern half pitch), X-rays that degrade the optical image can be reduced and a high resolution can be obtained.

Further, by carrying out exposure by combining a mask pattern wherein mask X-ray absorber dimensions are approximately 1.5 times half the pattern pitch (pattern half pitch) and a narrow banded exposure wavelength range, an even higher resolution can be obtained.

(First Embodiment)

In the present embodiment, the reason why it is difficult for the conventional X-ray proximity exposure method to obtain a fine periodic pattern is explained and, then, it is described that a high resolution, in comparison with that of the prior art, can be obtained by making the X-ray absorber pattern dimensions of a fine periodic pattern wider than the half pitch.

Figure 2:
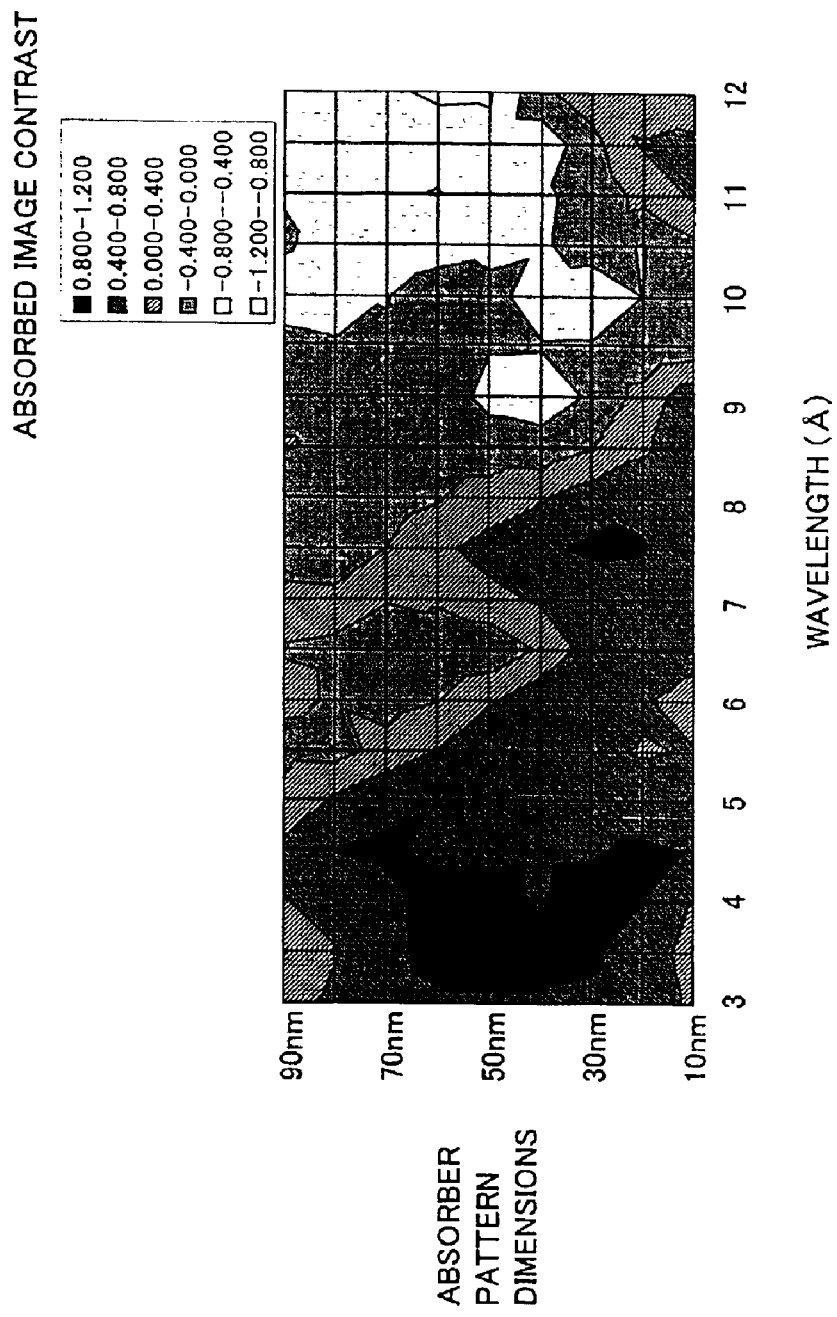
FIG. 2 is a diagram showing, the relationship between X-ray absorber mask pattern dimensions and the absorbed image contrast formed by X-ray wavelengths in a 50 nm half pitch periodic line and space mask pattern according to a first embodiment of the present invention.

FIG. 2 shows the results of finding the image contrast according to Fresnel diffraction of respective X-ray wavelengths, in reference to a 50 nm line and space periodic pattern, while changing the X-ray absorber pattern dimensions from 10 nm to 90 nm. The mask-wafer gap is 10 μm and the X-ray absorber material is tungsten (W) having a thickness of 300 nm. For example, in the case that the X-ray absorber pattern dimensions are 70 nm, contrast is found from the optical image of a 50 nm line and space periodic pattern using a 70 nm line and 30 nm space periodic mask pattern.

In reference to FIG. 2, in the case that the X-ray absorber pattern dimensions are 50 nm, there are ranges wherein the contrast becomes 0 or less, on the wavelength side longer than approximately 8 Å and between 6 Å and 7 Å, and it is understood that when these wavelengths are used the contrast is lowered.

Further, it is understood that when the X-ray absorber dimensions become smaller than 50 nm, the wavelength range wherein the contrast becomes 0 or less, are widened and pattern formation becomes increasingly difficult. When the X-ray absorber dimensions are made wider than 50 nm, X-ray contrast that has a contrast of 0 or less, increases together with the widening of the absorber pattern dimensions. In the case that the X-ray absorber pattern dimensions are 60 nm (1.2 times 50 nm), contrast becomes 0 or more, in the wavelength range of approximately 8 Å and less, and in the case that the X-ray absorber pattern dimensions are from 70 nm to 80 nm (1.4 to 1.6 times 50 nm), the wavelength range wherein contrast is 0 or more, stretches into the long wavelength side and, together, the contrast becomes maximum in the wavelength range of from 7 Å to 8 Å.

In the case that the X-ray absorber pattern dimensions are further widened to 90 nm (1.8 times 50 nm), though the contrast is somewhat lowered in part of the wavelength range, it is understood that the contrast in the greater portion of the wavelength range on the wavelength side shorter than approximately 9 Å becomes 0.4 or more, as a result of the further shifting of the range wherein contrast becomes 0 or more, to the longer wavelength side.

Consequently, when the X-ray absorber pattern dimensions are widened to between from approximately 1.2 times to 1.8 times the pattern half pitch (50 nm), a high quality optical image can be obtained because the contrast in regard to X-rays on the wavelength side shorter than approximately 8 Å to approximately 9 Å is improved in comparison with the contrast of the 50 nm line and space periodic mask pattern. Further, when the X-ray absorber pattern dimensions are between 70 nm and 80 nm (1.4 times to 1.6 times 50 nm), more preferably approximately 75 nm (approximately 1.5 times), there are wavelength ranges wherein contrast becomes even higher and a higher quality optical image can be obtained.

Further, because short wavelength X-rays of from 6 Å to 7 Å, which conventionally lower contrast, can contribute to optical image formation, an even higher resolution can be obtained.

In the present embodiment the reason for the difficulty in obtaining a 50 nm line and space periodic pattern when a mask-wafer gap is 10 $\mu$m according to a conventional X-ray proximity exposure method is explained and it is described that a 50 nm line and space pattern can be more easily obtained by widening the X-ray absorber pattern dimensions. The wavelength range contributing to contrast fluctuates according to pattern dimensions and mask-wafer gap so that wavelength range used in the case of the formation of finer patterns naturally differ from that of the present embodiment. However, even in that case, the effect of improvement in contrast and the expansion of the wavelength ranges that contribute to contrast can be expected due to making the X-ray absorber pattern dimensions wider than the pattern half pitch.

Though in the present embodiment a periodic pattern is used, there is the effect of the improvement in resolution as long as the pattern set is repeated two or more times.

(Second Embodiment)

In the present embodiment, the methods wherein the short wavelength side can be restricted by selecting the mirror material and the X-ray grazing incidence angle to a mirror and wherein the long wavelength side can be controlled according to the filter material and the filter film thickness, primarily, are described from among the methods for making the wavelength range more narrow banded than the conventional wavelength range.

X-rays that have been reflected two times using a rhodium coated mirror having a grazing incidence angle of 1 degree (angle from the axis perpendicular to the mirror to the incident X-ray) from an electron storage ring (0.8 GeV, 4.5 T), and that have been transmitted through a beryllium vacuum protection filter having a thickness of 18 $\mu$m and through a 150 torr helium atmosphere of 73.8 cm are used so as to expose a PHS resist, having a film thickness of 0.2 $\mu$m and a density of 1.0 g/cm$^3$, on a silicon substrate after the X-rays have been transmitted through an X-ray mask using diamond as an X-ray transmitting body.

Figure 3:
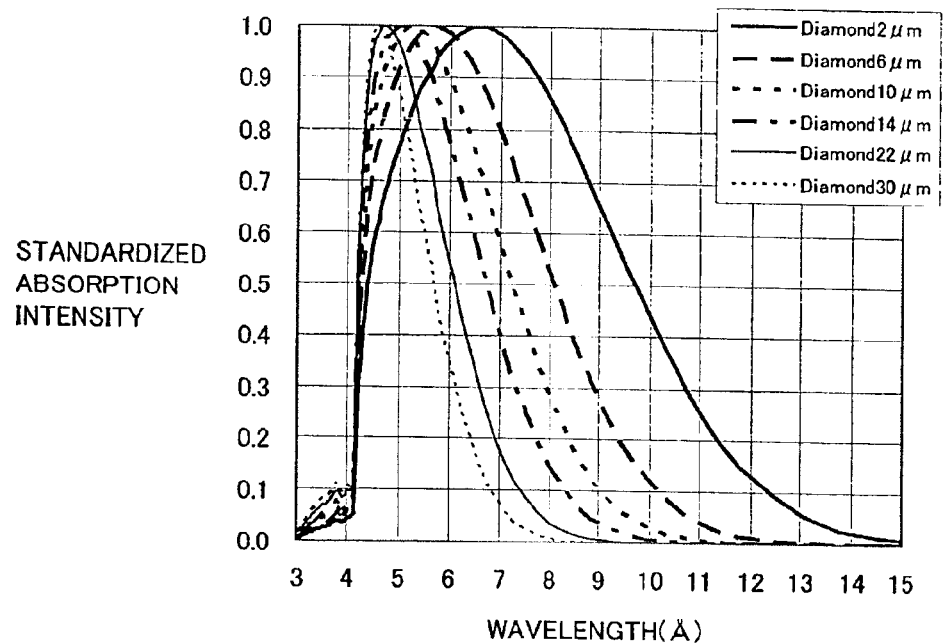
FIG. 3 is a diagram showing the standardized absorbed energy spectrum of a PHS resist in accordance with respective differing diamond film thicknesses according to a second embodiment of the present invention.

FIG. 3 is a plot diagram of energy absorbed in a PHS resist by standardizing peak intensities of respective spectrums to 1 while changing the diamond film thickness from 2 $\mu$m to 30 $\mu$m. Short wavelength components can be restricted to approximately 4 Å by using a rhodium mirror. Long wavelength components are reduced when the diamond film thickness is thickened and, therefore, pattern resolution can be improved by thickening the film thickness of diamond.

In the present embodiment, a rhodium coated mirror with an 89 degree incidence is used for reducing short wavelength components but a cobalt or nickel coated mirror may also be used. Further, though long wavelength components were reduced by thickening the diamond film thickness of the X-ray transmitting body, a diamond film may be inserted into the beam line without being limited to an X-ray transmitting body. Further, a beryllium or a boron nitride film may be used in place of diamond in order to obtain the same effect of improvement in resolution.

(Third Embodiment)

In the present embodiment, the methods wherein the short wavelength side can be restricted by selecting the mirror material and the X-ray grazing incidence angle and wherein the long wavelength side can be restricted by utilizing the absorption edges of elements contained in a resist, primarily, are described from among the methods for making the wavelength range more narrow banded than the conventional wavelength range.

Figure 4:
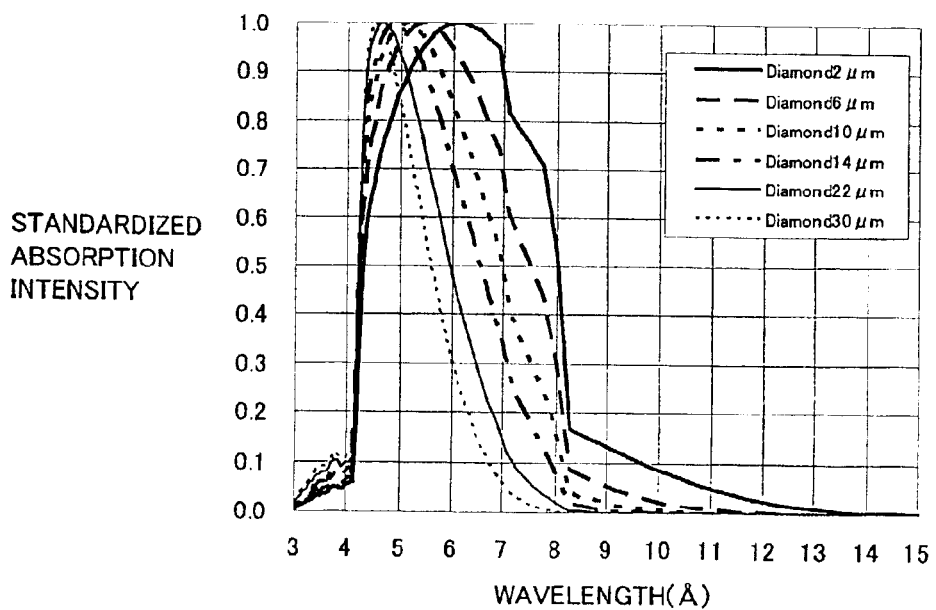
FIG. 4 is a diagram showing the standardized absorbed energy spectrum of a PHS resist having 50 wt. % content of bromine in accordance with respective differing diamond film thicknesses according to a third embodiment of the present invention.

A beam line that is the same as that in the above-mentioned second embodiment is used so that a brominated PHS resist with 50 wt. % content of bromine was exposed as a resist material. Because bromine has an absorption edge at 7.8 Å, the absorption amount of X-rays of shorter wavelengths than 7.8 Å in the brominated PHS resist increases more than that in a PHS resist so that the ratio of wavelength components longer than 7.8 Å is relatively lowered. FIG. 4 is a plot diagram of energy absorbed in a brominated PHS resist (density 2 g/cm$^3$) with a bromine content of 50 wt. %, by standardizing peak intensities of respective spectrums to 1 while changing the diamond thickness from 2 $\mu$m to 30 $\mu$m.

Figure 5:
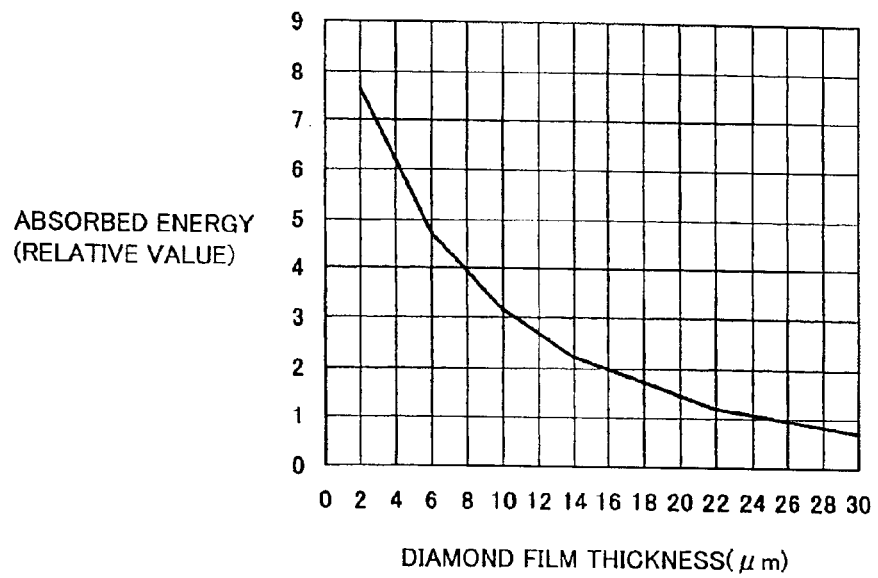
FIG. 5 is a diagram showing relative values of absorbed energy that is absorbed into the PHS resist having 50 wt. % content of bromine in accordance with respective differing diamond film thicknesses according to the third embodiment.

FIG. 5 shows the energy absorbed in a brominated PHS resist standardized so that the amount of absorbed energy absorbed in a conventional PHS resist becomes 1 wherein an X-ray transmitting body made of diamond having a film thickness of 2 $\mu$m is used.

According to FIG. 4, even in the case that a diamond film having a thickness of 2 $\mu$m the same as in the prior art is used, wavelength components longer than approximately 8 Å can be significantly reduced in a brominated PHS resist. Long wavelength components are further reduced as the film thickness of the diamond film is thickened. As for short wavelength components, wavelength components shorter than 4 Å are removed by using a rhodium mirror. Consequently, according to the present embodiment, exposure is carried out with the X-ray spectrum narrow banded to from 4 Å to 8 Å and, therefore, the reduction of X-rays of 8 Å or more, that degrade the optical image of a 50 nm line and space periodic pattern so that a 50 nm line and space periodic pattern can easily be formed.

Further, as described above in the first embodiment, a higher resolution can be obtained when an X-ray absorber pattern wider than the pattern half pitch is used as an X-ray absorber pattern.

Moreover, according to FIG. 5, the absorbed energy increases approximately seven times or more, in a brominated PHS resist in comparison with absorbed energy in a conventional PHS resist in the case of a diamond film thickness of 2 $\mu$m and, because even when the diamond film is thickened to approximately 25 $\mu$m, the absorbed energy is approximately the same as the absorbed energy of a PHS resist, a high resolution and, at the same time, a high sensitivity can be achieved.

Though in the present embodiment the narrow banding of the absorption spectrum by using a resist material containing bromine is explained, when a resist material that contains an element with an absorption edge in the wavelength range of from 4 Å to 8 Å is used, the X-ray absorption amount of wavelengths shorter than the absorption edge increases and, therefore, the X-ray absorption amount of wavelengths longer than the absorption edge is relatively reduced in regard to the X-ray absorption amount of wavelengths shorter than the absorption edge so that the absorption spectrum is narrow banded. Wavelength components that degrade the optical image can be reduced so that a resolution higher than in the conventional X-ray exposure method can be obtained. In concrete terms, in addition to bromine, silicon (absorption edge of 6.9 Å), phosphorus (absorption edge of 5.7 Å), sulfur (absorption edge of 5.0 Å) and chlorine (absorption edge of 4.4 Å) are appropriate as elements to be contained in the resist material.

(Fourth Embodiment)

In the present embodiment, the methods wherein the short wavelength side can be restricted by utilizing the absorption edge of the filter material and wherein the long wavelength side can be restricted by utilizing the absorption edges of elements contained in a resist, primarily, are described from among the methods for making the wavelength range more narrow banded than the conventional wavelength range.

X-rays that have been reflected two times using a rhodium coated mirror having a grazing incidence angle of 89 degree from an electron storage ring (0.8 GeV, 4.5 T), and that have been transmitted through a beryllium vacuum protection filter having a thickness of 18 $\mu$m, a platinum filter and through a 150 torr helium atmosphere of 73.8 cm are used so as to expose a PHS resist, as a resist material, having a film thickness of 0.2 $\mu$m and a density of 2.0 g/cm$^3$, on a silicon substrate after the X-rays have been transmitted through an X-ray mask using diamond having a film thickness of 2 $\mu$m as an X-ray transmitting body.

Figure 6:
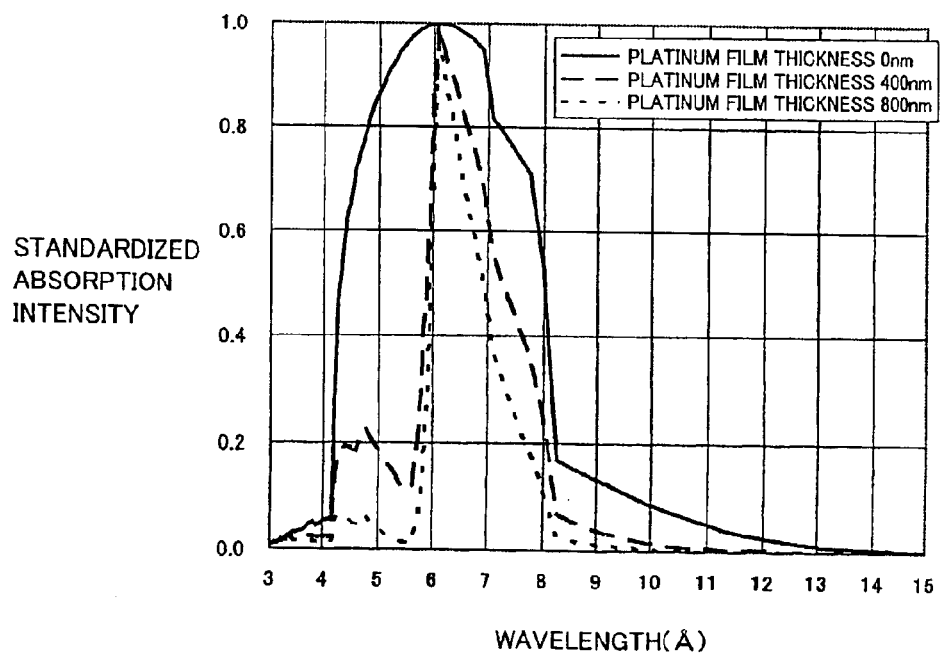
FIG. 6 is a plot diagram showing the standardized absorbed energy spectrum of a brominated PHS resist while changing the film thickness of a platinum filter according to a fourth embodiment.

FIG. 6 shows the absorbed energy spectrum of a brominated PHS resist at the time the film thickness of a platinum filter was changed in the range of from 0 nm to 800 nm. The intensity is standardized so that the peak intensity becomes 1. Though in the case of a platinum filter film thickness of 0, primarily X-rays in the wavelength range of 4 Å to 8 Å were absorbed, it is understood that by inserting the platinum filter, X-ray wavelength components shorter than approximately 6 Å are greatly reduced and wavelength components longer than 8 Å are also slightly reduced.

Short wavelength components are reduced because the absorption edge of platinum is at 5.7 Å so that X-rays of wavelengths shorter than 5.7 Å are absorbed by the platinum filter and the short wavelength X-rays arriving at the surface of the resist have been reduced by that amount. Consequently, in the present embodiment, because the resist pattern is formed by X-rays that have been narrow banded to the wavelength range of approximately 6 Å to 8 Å, secondary electron fuzziness generated according to X-rays of wavelengths shorter than 6 Å is reduced and, moreover, because long wavelength components that lower resolution are also lowered, a higher resolution than in the conventional X-ray exposure method can be obtained.

Though in the present embodiment, a platinum filter was inserted into the beam line, the same manner of narrow banding effect can be obtained by making the filter contain elements that have absorption edges on the wavelength side even shorter than the absorption edges on the wavelength side shorter than 8 Å of the elements contained in the resist material.

For example, in the case of using a PHS resist containing bromine as the resist material, a filter containing any one, or more, of the elements from among: selenium (absorption edge of 8.8 Å), silicon (absorption edge of 6.9 Å), hafnium (absorption edge of 7.3 Å), tantalum (absorption edge of 7.3 Å), aluminum (absorption edge of 7.8 Å), tungsten (absorption edge of 6.9 Å), rhenium (absorption edge of 6.4 Å), osmium (absorption edge of 6.4 Å), rubidium (absorption edge of 6.9 Å), yttrium (absorption edge of 6.0 Å), gold (absorption edge of 5.7 Å), molybdenum (absorption edge of 5.0 Å), (absorption edge of 6.4 Å), lead (absorption edge of 5.0 Å), ruthenium (absorption edge of 4.4 Å), rhodium (absorption edge of 4.1 Å), and the like, will be effective because bromine has an absorption edge of 7.8 Å.

Further, when a filter with an absorption edge on the wavelength side shorter than 8 Å shown in the present embodiment as well as a filter of carbon or beryllium, and the like, not having an absorption edge on the wavelength side shorter than 8 Å are used in combination, both short wavelength components and long wavelength components can be efficiently reduced.

(Fifth Embodiment)

In the present embodiment, the methods wherein the short wavelength side can be restricted through the selection of the mirror material and through the selection of the X-ray grazing incidence angle to a mirror and wherein the long wavelength side can be restricted by utilizing the absorption edges of elements contained in a resist material, primarily, are described from among the methods for making the wavelength range more narrow banded than the conventional wavelength range.

Figure 7:
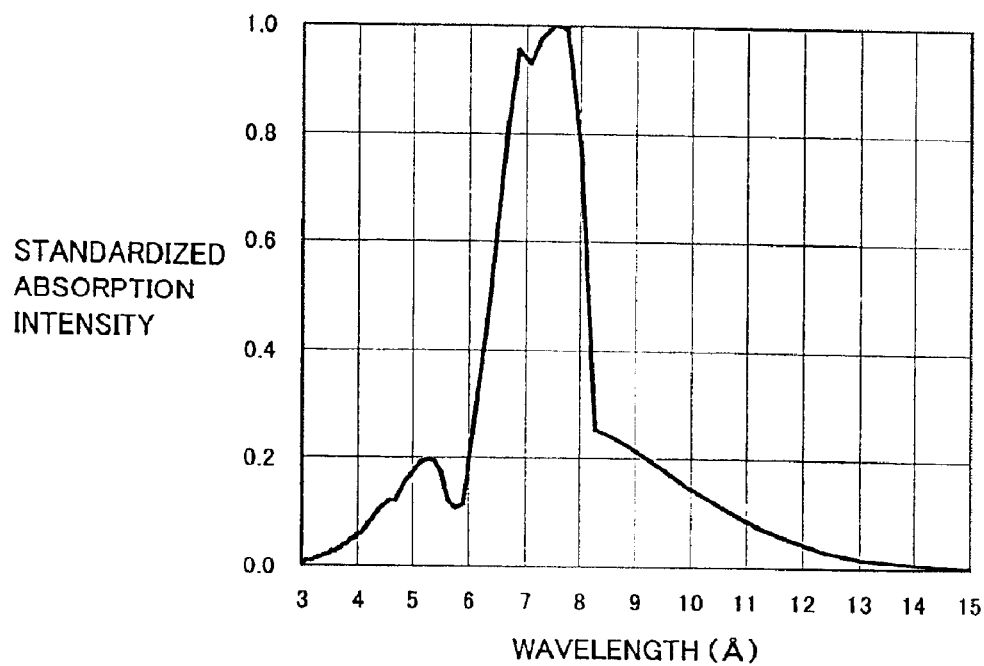
FIG. 7 is a diagram showing the standardized absorbed energy spectrum of a brominated PHS resist according to a fifth embodiment.

X-rays that have been reflected one time using a platinum coated mirror having a grazing incidence angle of 88.8 degrees from an electron storage ring (0.8 GeV, 4.5 T), and that have been transmitted through a beryllium vacuum protection filter having a thickness of 18 $\mu$m and through a 150 torr helium atmosphere of 73.8 cm are used so as to expose a PHS resist, as a resist material, having a film thickness of 0.2 $\mu$m and a density of 2.0 g/cm$^3$, on a silicon substrate after the X-rays have been transmitted through an X-ray mask using diamond having a film thickness of 2 $\mu$m as an X-ray transmitting body. FIG. 7 shows an absorbed energy spectrum of a brominated PHS resist. The intensity is standardized so that the peak intensity becomes 1.

As shown in FIG. 7, wavelength components longer than the absorption edge of bromine are reduced by using a resist containing bromine. As for short wavelength components, wavelength components shorter than approximately 6 Å can be efficiently reduced by using a platinum coated mirror with a grazing incidence angle of 88.8 degrees.

In the present embodiment, X-rays having wavelengths longer than approximately 6 Å are primarily absorbed and, therefore, secondary electron fuzziness due to X-ray wavelengths shorter than 6 Å is relaxed so that a higher resolution can be obtained.

In the present embodiment, short wavelength components can be reduced in a simple beam line configuration having a single mirror, without inserting a filter.

(Sixth Embodiment)

In the present embodiment, the resolution of a fine pattern in the case of the combined use of a method for making a wavelength range more narrow banded than the conventional wavelength range and a periodic mask pattern wherein the mask absorber dimensions are larger than the half pitch is examined.

X-rays that have been reflected two times using a platinum coated mirror having a grazing incidence angle of 89 degrees from an electron storage ring (0.585 GeV, 3.5 T), and that have been transmitted through a beryllium vacuum protection filter having a thickness of 18 µm are used so as to expose a PHS resist on a silicon substrate after the X-rays have been transmitted through an X-ray mask using silicon carbide as an X-ray transmitting body.

Figure 8:
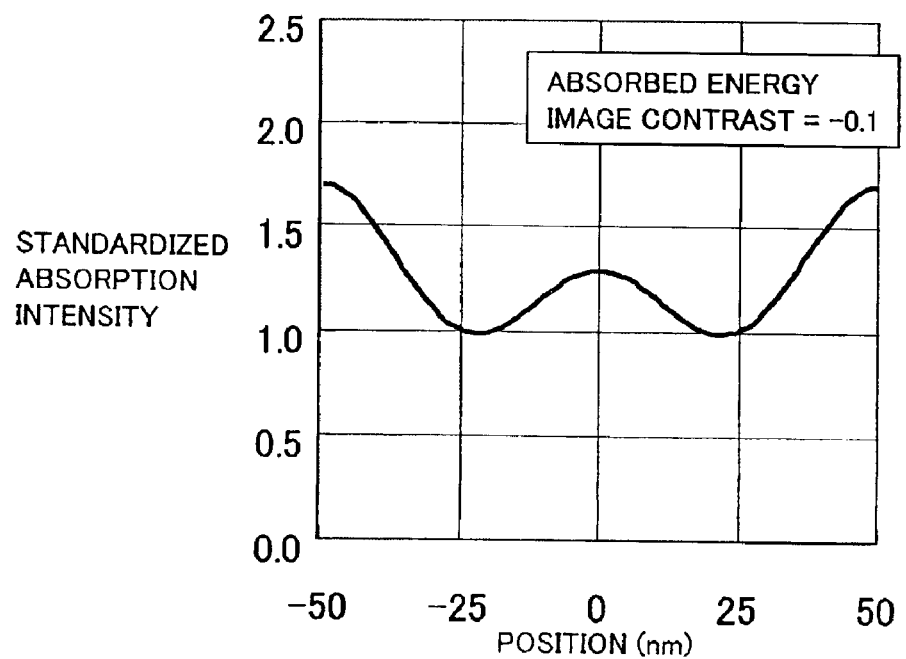
FIG. 8 is a diagram showing the absorbed energy image in a PHS resist of a 50 nm line and space periodic pattern formed by a conventional exposure method according to a sixth embodiment.

FIG. 8 shows the absorbed energy image in a PHS resist as transmitted through a 50 nm line and space predetermined mask pattern according to the conventional exposure method. Here, an X-ray transmitting body of a diamond film having a thickness of 2 µm and an X-ray absorber of tungsten having a thickness of 300 nm are used and a mask-wafer gap is set at 10 µm for calculation. Furthermore, line portions on the X-ray mask are the X-ray absorber and space portions are regions wherein there is no X-ray absorber. In the figure, the range from −25 nm to +25 nm is a region on the mask wherein there is no X-ray absorber.

It is understood that the intensity of the absorbed energy image beneath the X-ray absorber is greater than in the regions wherein there is no X-ray absorber and the contrast becomes of a negative value and a pattern cannot be formed. The ratio of X-rays of wavelengths longer than 8.5 Å, which degrade the optical image, is approximately 50% of the total absorbed energy. In other words, this shows that 50% of the energy, from among the absorbed energy, is deteriorating the optical image.

Figure 9:
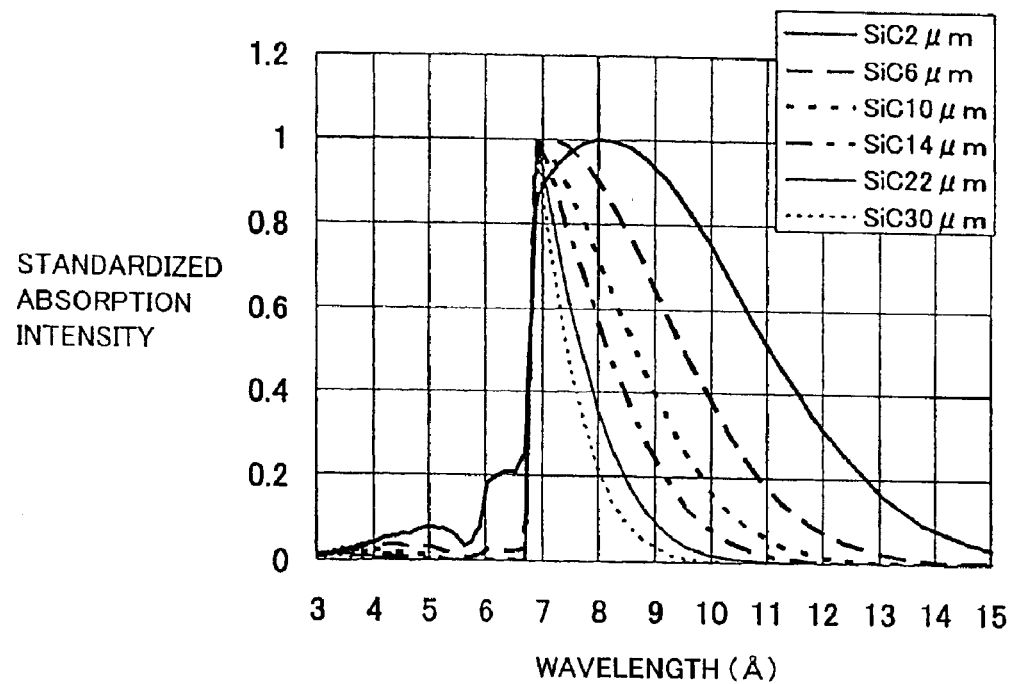
FIG. 9 is a plot diagram of a standardized absorbed energy spectrum of a PHS resist in accordance with change in the film thickness of silicon carbide according to the sixth embodiment.
Figure 10:
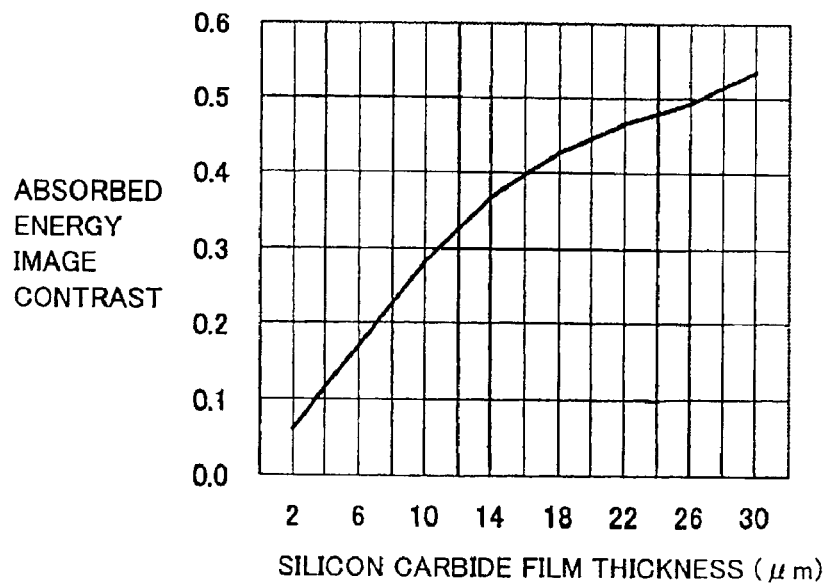
FIG. 10 is a plot diagram of the contrast of an absorbed energy image of a PHS resist in accordance with change in the film thickness of silicon carbide according to the sixth embodiment.

FIG. 9 is a plot diagram showing the absorbed energy of a PHS resist that is standardized so that the peak intensities of respective spectrums become 1 while changing the thickness of a silicon carbide X-ray transmitting body from 2 µm to 30 µm. FIG. 10 shows the contrast of the absorbed energy image of a resist according to a 50 nm line and space periodic pattern when a tungsten X-ray absorber with a film thickness of 300 nm is used as an X-ray absorber and when a 70 nm line and 30 nm space periodic mask pattern wherein X-ray absorber pattern dimensions are enlarged to be 1.4 times of those of a 50 nm line and space periodic pattern is used. The mask-wafer gap is 10 µm.

In order to reduce short wavelength components, the absorption edge of silicon (6.9 Å) of the X-ray transmitting body is primarily used. In order to reduce long wavelength components, the beryllium of the vacuum protection filter as well as the silicon and carbon of the X-ray transmitting body are used. Silicon carbide with a thickness of 2 µm is the X-ray transmitting body that has been conventionally used.

It is understood from FIG. 9 that when the film thickness of silicon carbide is thickened, wavelength components shorter than 6.9 Å become reduced and, together with this, long wavelength components become greatly reduced. Short wavelength components are reduced because absorption of X-rays by the silicon of the X-ray transmitting body increases in regard to wavelengths of 6.9 Å or less, due to the 6.9 Å absorption edge of silicon so that X-rays of short wavelengths arriving at the resist are reduced. Further, long wavelength components are reduced because the absorption by the silicon and the carbon of the X-ray transmitting body increases together with the thickening of the film thickness. In this manner, short wavelength components and long wavelength components can simultaneously be reduced when the film thickness of silicon carbide is thickened. It was understood that, as is shown in FIG. 10, the absorbed energy image contrast improves together with the thickening of the film thickness of the silicon carbide and a 50 nm line and space periodic pattern can easily be resolved.

In particular, when the film thickness of the silicon carbide is 10 µm, or more, a pattern can be formed. As an index of narrow banding, when the wavelength range Δλ wherein the absorption intensity becomes half is used, Δλ becomes approximately 2.5 Å in the case of silicon carbide having a thickness of 10 µm so that it was understood that a satisfactory pattern can be obtained when Δλ is approximately 2.5 Å or less.

In this manner, when the film thickness of silicon carbide is thickened, fuzziness due to secondary electrons in the resist and fuzziness of the optical image due to Fresnel diffraction can be restricted and a high resolution can be obtained.

Furthermore, though in the present embodiment the case of the thickening of silicon carbide film thickness of the X-ray transmitting body was examined, silicon carbide having a thickness of 2 µm or more, may be inserted into the beam line without being limited to an X-ray transmitting body so that the effect of improvement in resolution can be obtained and the same effect can be obtained with materials including silicon, such as silicon nitride.

(Seventh Embodiment)

Though a PHS resist was examined as a resist material in the above-mentioned sixth embodiment, in the present embodiment X-ray exposure is carried out using a beam line that is the same as that in the sixth embodiment on a brominated PHS resist containing 40 wt. % of bromine, as a resist material.

Figure 11:
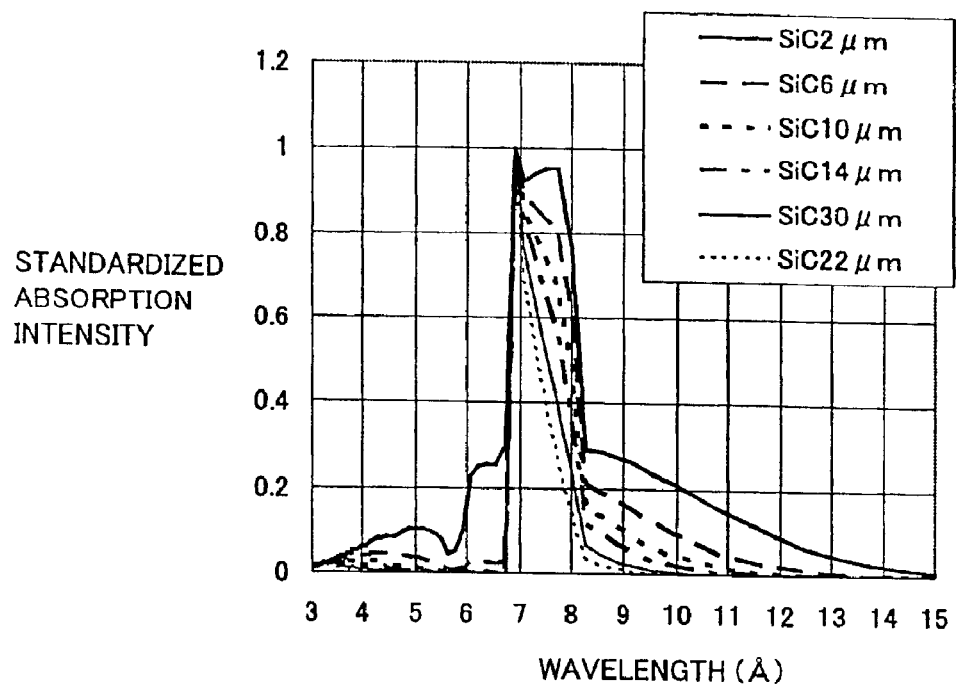
FIG. 11 is a plot diagram of a standardized absorbed energy spectrum of a brominated PHS resist in accordance with change in the film thickness of silicon carbide according to a seventh embodiment.
Figure 12:
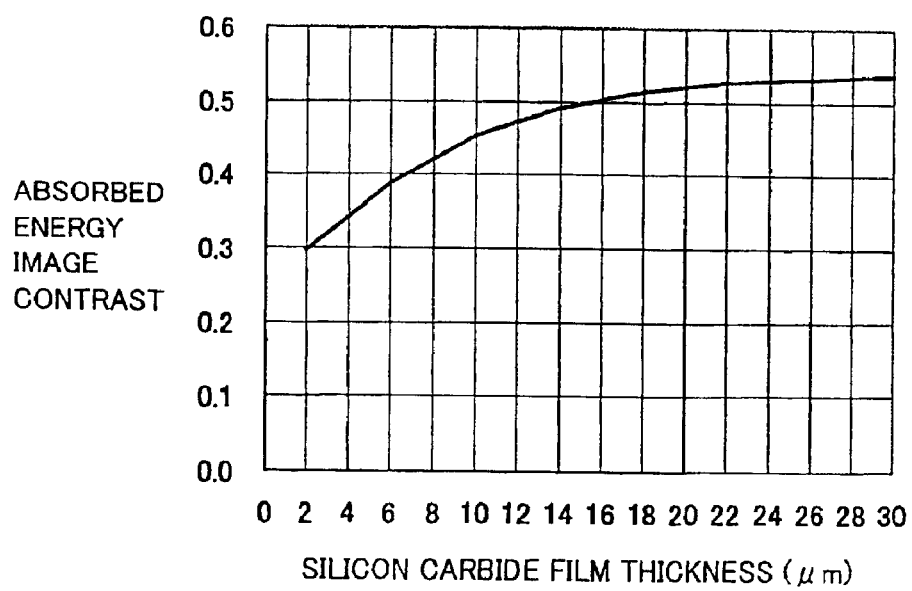
FIG. 12 is a plot diagram of the contrast of an absorbed energy image of a brominated PHS resist in accordance with change in the film thickness of silicon carbide according to the seventh embodiment.
Figure 13:
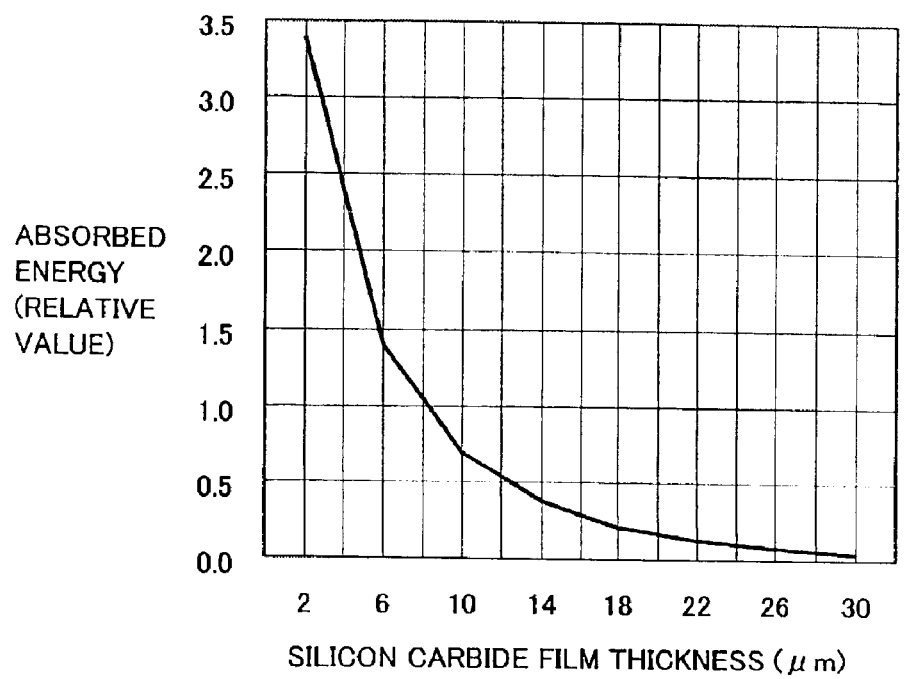
FIG. 13 is a diagram showing, in accordance with respective diamond film thicknesses, the absorbed energy absorbed in a PHS resist, which is standardized so that the absorbed energy absorbed in a brominated PHS resist using a 2 $\mu$m thick silicon carbide X-ray transmitting body becomes 1 according to the seventh embodiment.

FIG. 11 is a plot diagram of the energy absorbed in a brominated PHS resist that is standardized so that the peak intensities of respective spectrums become 1 while changing the thickness of silicon carbide of an X-ray transmitting body from 2 µm to 30 µm. FIG. 12 shows the contrast of an absorbed energy image in a resist according to a 50 nm line and space periodic pattern using a tungsten film with a film thickness of 300 nm as an X-ray absorber. Here, the X-ray absorber pattern dimensions of 70 nm are 1.4 times larger than the half pitch of 50 nm and a 70 nm line and 30 nm space periodic mask pattern is used for exposure. The mask-wafer gap at the time of exposure is 10 µm. FIG. 13 shows the relative intensity of the absorbed energy that is standardized so that the energy absorbed by a PHS resist with a silicon carbide film thickness of 2 µm becomes 1.

It is understood from FIG. 11 concerning the spectral distribution of absorbed energy that, by adding bromine, the ratio of wavelength components longer than from the vicinity of 8 Å is extremely reduced and there is narrow banding to the range of from approximately 7 Å to 8 Å even in the case of silicon carbide having a thickness of 2 µm. In other words, as for a 50 nm line and space periodic pattern, it is possible to extremely restrict long wavelength components that degrade the optical image.

It is understood from FIG. 12 that, as for the contrast of a 50 nm line and space periodic pattern, there is a great improvement wherein approximately 0.3 can be obtained in comparison with the conventional PHS contrast (−0.1) even with an X-ray transmitting body of silicon carbide having a thickness of 2 µm, and, moreover, contrast is improved together with the thickening of the film thickness. In the case of these exposure conditions, the wavelength range Δλ wherein the absorption intensity is halved is approximately 1.4 Å and is lower than the Δλ (=2.5 Å) in the case that silicon carbide with a film thickness of 10 µm is used in the above-mentioned sixth embodiment. In other words, it is understood that narrow banding can be achieved without thickening the film thickness of silicon carbide when a resist containing bromine is used as a resist material.

Moreover, it is seen from FIG. 13 that the amount of absorbed energy increases by approximately 3.4 in comparison with the case wherein a PHS resist with silicon carbide having a film thickness of 2 µm is used and improvement in throughput can be expected.

Further, even when the film thickness of silicon carbide is thickened to approximately 8 µm, there is approximately the same as the conventional amount of absorbed energy so that an improvement in resolution, with throughput maintained as is, can be expected.

Figure 14:
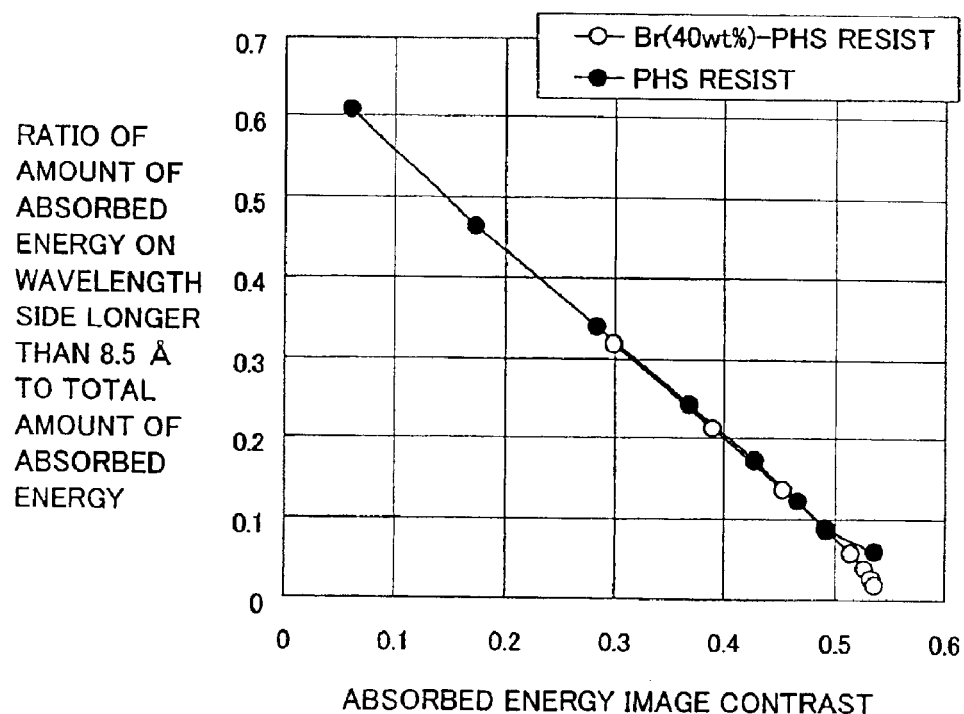
FIG. 14 is a plot diagram of ratios of the absorbed energy for the wavelength side longer than 8.5 Å to the total absorbed energy in a brominated PHS resist and a PHS resist in accordance with the absorbed energy image contrast of a 50 nm line and space periodic pattern according to the seventh embodiment.
Figure 15:
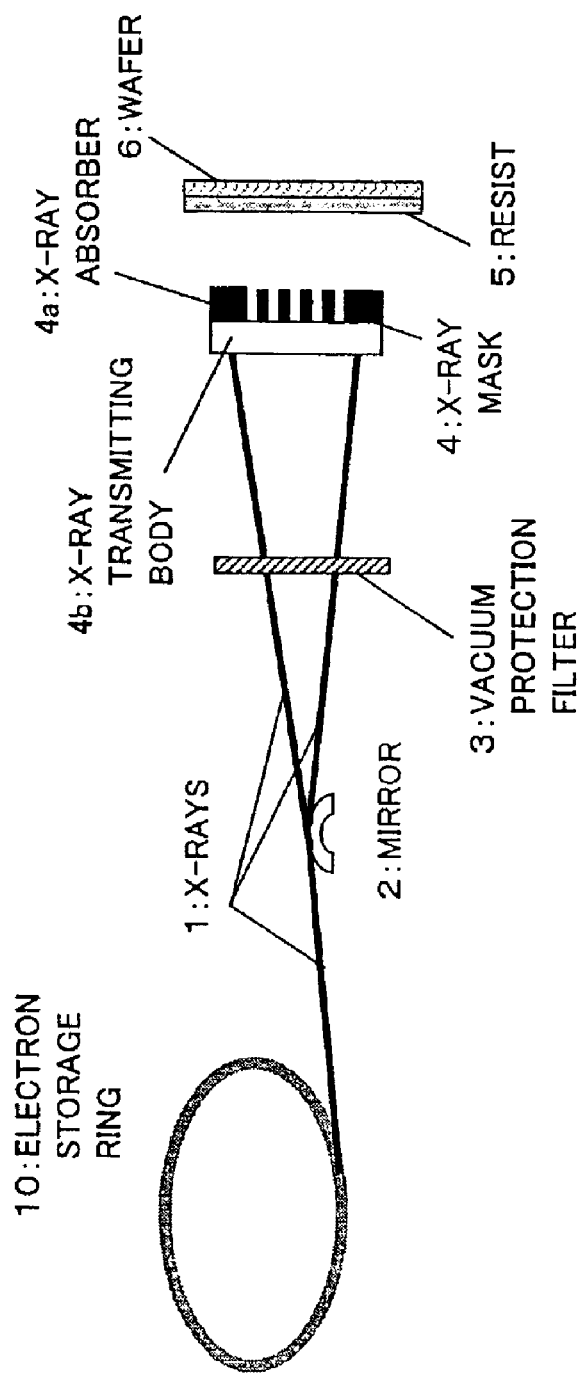
FIG. 15 is a schematic diagram for describing a proximity X-ray exposure method according to a prior art.
Figure 16:
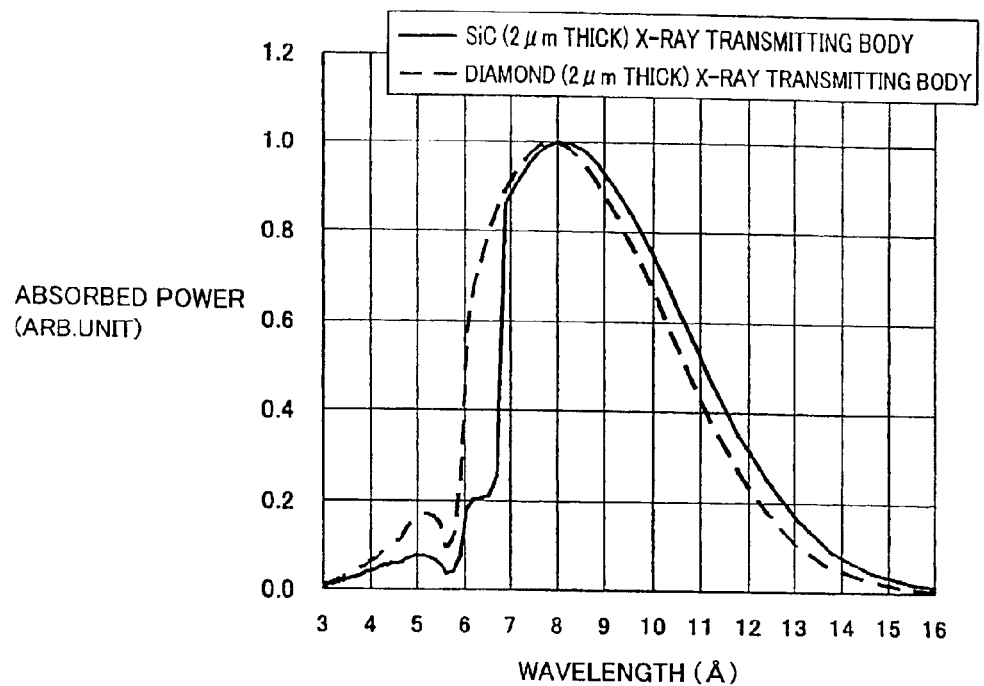
FIG. 16 is a diagram showing the X-ray spectrum absorbed by a resist in accordance with an X-ray proximity exposure method according to a prior art.
Figure 17:
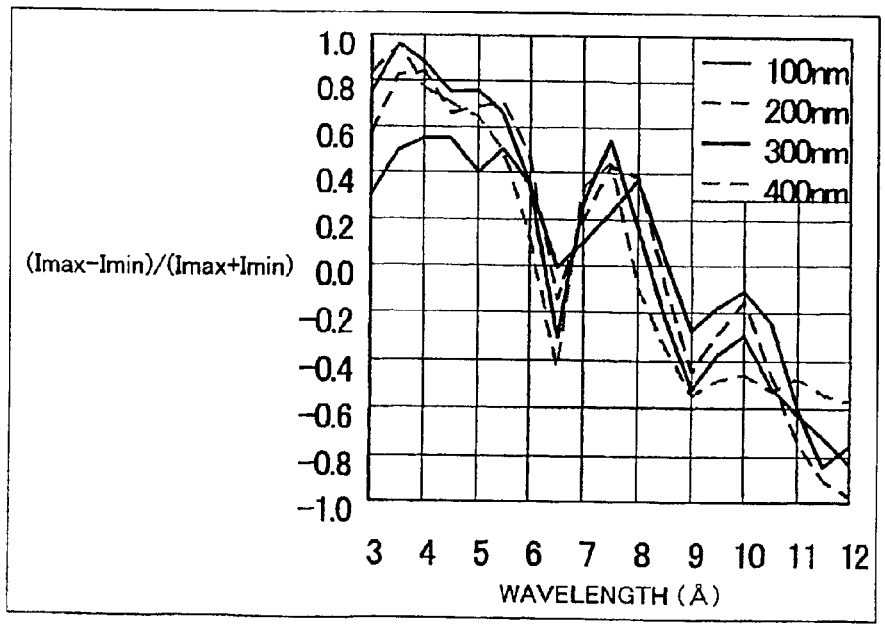
FIG. 17 is a diagram showing the contrast of an absorbed energy image in accordance with respective X-ray wavelengths in regard to a 50 nm line and space periodic mask pattern according to a prior art.
Figure 18:
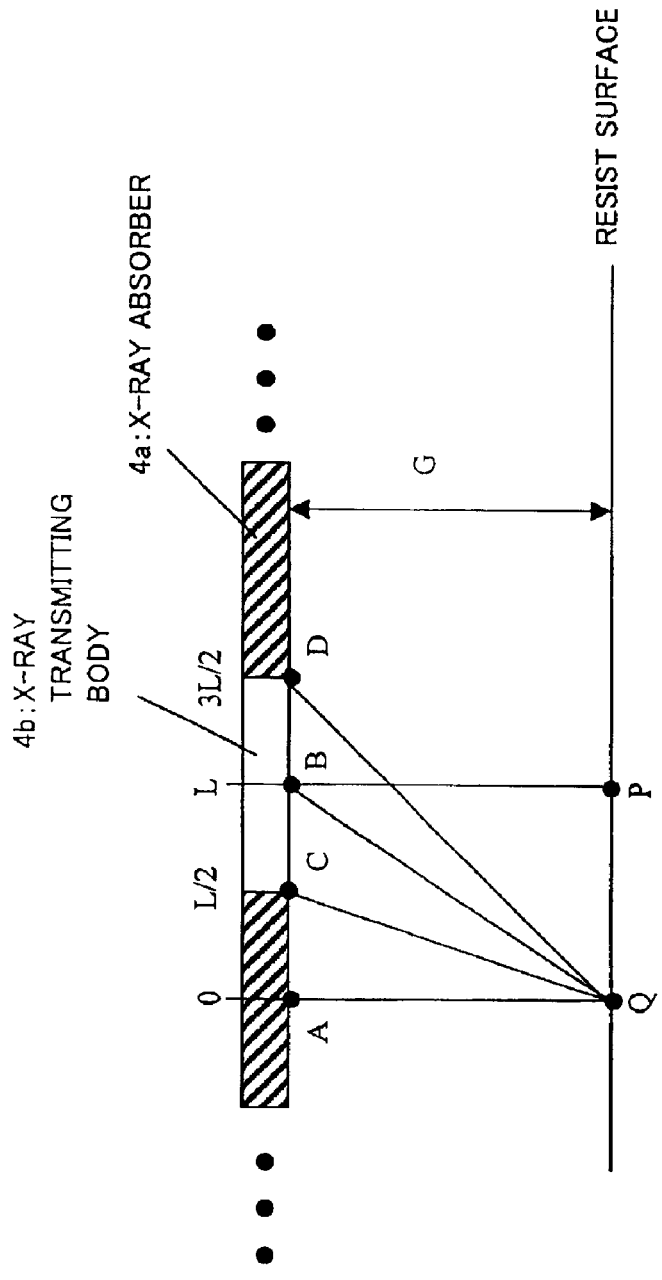
FIG. 18 is a schematic diagram for describing X-ray phase conditions for obtaining a high contrast optical image and problems therein according to a prior art.

FIG. 14 is a plot diagram of the ratio of absorbed energy of the wavelength side longer than 8.5 Å in regard to the total absorbed energy vis-à-vis the contrast of the absorbed energy image of a 50 nm line and space periodic pattern. As for the resist material, the case of a PHS resist and the case of a PHS resist containing 40 wt. % of bromine are shown. As is described in the sixth embodiment above, the absorption image contrast of the 50 nm line and space periodic pattern has a negative value because 50% of the absorbed energy is of the absorption of X-rays of the wavelength side longer than 8.5 Å according to the conventional exposure method.

In the present embodiment, even if the ratio of absorption of X-rays having wavelengths longer than 8.5 Å is 50%, the contrast becomes approximately 0.15 and is improved because the dimensions of the X-ray absorber are made wider than the half pitch.

However, whether or not the pattern can actually be formed is dependent on resist performance and process condition, in addition to the optical image, and in the present embodiment in both cases of a PHS resist and a PHS resist containing Br with contrast conditions of 0.3 or more, a resist pattern can be formed. It is understood from FIG. 9 that in order to obtain a contrast of 0.3 or more, it is necessary to restrict the absorption ratio of X-rays having wavelengths longer than 8.5 Å to 0.3 or less.

Further, the wavelength range that causes deterioration of the absorbed energy image varies according to variation in pattern dimensions R, other than 50 nm, or in mask-wafer gap G. When the wavelength that degrades the absorbed energy image in regard to pattern dimensions R is posited as is λlimit, an improvement in resolution can also be expected in regard to pattern dimensions R other than 50 nm in the case that narrow banding is carried out so that the absorption ratio of X-rays of the wavelength side longer than the λlimit to the total absorbed energy becomes 0.3 or less.

As described in regard to the prior art, resolution is proportional to $k(\lambda \times G)^{1/2}$ so it is considered that wavelength λlimit that degrades the absorbed energy image is proportional to $R^2/G$. When λlimit=8.5 Å, R=50 nm and G=10 µm, the proportional coefficient is 0.034 (=8.5 Å/50 nm²×10 µm). Consequently, by reducing X-rays of the wavelength side longer than λlimit obtained according to λlimit=0.034× $R^2/G$, improvement in resolution can be expected in regard to differing pattern dimensions and mask-wafer gaps.

For example, in the case of a mask-wafer gap of 10 µm, λlimit is approximately 8.5 Å, 6.9 Å, 5.4 Å and 4.2 Å corresponding to patterns of 50 nm, 45 nm, 40 nm and 35 nm, respectively, and in the case of a mask-wafer gap of 8 µm, λlimit is approximately 10.6 Å, 8.6 Å, 6.8 Å and 5.2 Å corresponding to patterns of 50 nm, 45 nm, 40 nm and 35 nm, respectively, and in the case of a mask-wafer gap of 6 µm, λlimit is approximately 14.2 Å, 11.5 Å, 9.1 Å and 6.9 Å corresponding to patterns of 50 nm, 45 nm, 40 nm and 35 nm, respectively.

(Eighth Embodiment)

In the present embodiment an example is described wherein a method for making a wavelength range more narrow banded than the conventional wavelength range and a method using a periodic mask pattern wherein mask absorber dimensions are larger than the half pitch are used in combination to form a fine pattern and, then, the fine pattern that has been formed is processed so that a semiconductor device is manufactured.

X-rays that have been reflected two times using a platinum coated mirror having a grazing incidence angle of 89 degrees from an electron storage ring (0.585 GeV, 3.5 T), and that have been transmitted through a beryllium vacuum protection filter having a thickness of 18 µm are used so as to expose a PHS resist having a thickness of 0.2 µm on a substrate after the X-rays have been transmitted through an X-ray mask using a diamond film having a thickness of 6 µm as an X-ray transmitting body.

A resist pattern with 50 nm pattern dimensions can be formed in the case that an X-ray mask pattern with a 100 nm pitch periodic pattern having an X-ray absorber pattern width of 75 nm is used and a gap between an X-ray mask and a substrate with an attached resist is 10 µm.

A resist pattern with 35 nm pattern dimensions can be formed in the case that an X-ray mask pattern with a 70 nm pitch periodic pattern having an X-ray absorber pattern width of 50 nm is used and a gap between an X-ray mask and a substrate with an attached resist is 5 µm.

Next, an etching process is carried out on the substrate using this resist pattern as a mask, a new film is formed on the substrate after washing and, again, resist application, exposure as well as processing, cleaning and film formation are repeated in order to manufacture a semiconductor device. In the present embodiment, a pattern with a high resolution can be obtained, even when the mask-wafer gap was made wider than in the prior art, by using a mask pattern with X-ray absorber pattern dimensions approximately 1.5 times larger than the half pitch of the periodic pattern. It is very important to widen the mask-wafer gap in order to increase throughput because, by widening the mask-wafer gap, mask damage due to substrate contact can be prevented and, at the same time, high-speed movement of the stage for the substrate with attached resist becomes possible.

According to this invention, it becomes possible to provide an X-ray exposure method that makes possible the obtaining of a high resolution, a semiconductor device manufactured by means of this X-ray exposure method as well as an X-ray mask, X-ray exposure unit and resist material.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An X-ray exposure method comprising emitting X-rays from an X-ray source transiting at least one of a mirror and an X-ray filter and an X-ray transmitting body, and irradiating a resist with the X-rays, thereby transcribing a resist pattern having minimum pattern dimensions (R) with a mask-wafer gap (G), and a ratio of absorbed energy on a wavelength side longer than λlimit (=0.034×$R^2$/G) to total absorbed energy of no more than 0.3 in an absorption spectrum absorbed by the resist.

2. The X-ray exposure method according to claim 1, including using a periodic mask pattern in which an X-ray absorber mask pattern and a space pattern without an X-ray absorber are aligned in alternation, thereby forming a periodic pattern on a resist, wherein the X-ray absorber mask pattern dimensions are in a range of approximately 1.2 times to approximately 1.8 times a half pitch of the periodic mask pattern.

3. A semiconductor device formed by using X-ray exposure wherein X-rays emitted from an X-ray source irradiate a resist after transiting one of, at least, a mirror and an X-ray filter and an X-ray transmitting body, and wherein a resist pattern of minimum pattern dimensions (R) is transcribed with a mask-wafer gap (G) so that a ratio of absorbed energy on a wavelength side longer than $\lambda\text{limit}$ ($=0.034 \times R^2/G$) to total absorbed energy is 0.3 or lower in an absorption spectrum absorbed by the resist, and processing of the resist pattern formed.

* * * * *